United States Patent [19]

Snedkerud

[11] 4,257,122
[45] Mar. 17, 1981

[54] APPARATUS FOR IMPROVING THE EFFICIENCY OF THE MODULATION STAGE OF A TRANSMITTER

[75] Inventor: Ole Snedkerud, Windisch, Switzerland

[73] Assignee: Patelhold Patentverwertungs- & Elektro-Holding AG, Glarus, Switzerland

[21] Appl. No.: 961,697

[22] Filed: Nov. 17, 1978

[30] Foreign Application Priority Data

Nov. 29, 1977 [CH] Switzerland ............... 14576/77

[51] Int. Cl.³ .............................................. H04B 1/02
[52] U.S. Cl. .................................. 455/91; 455/103; 455/114; 332/64
[58] Field of Search ................. 333/14; 325/105, 120, 325/123, 144, 187; 364/851, 857; 328/145; 332/64; 455/91, 103, 114, 116

[56] References Cited

U.S. PATENT DOCUMENTS

| | | |
|---|---|---|
| 3,274,381 | 9/1966 | Amano et al. ............ 364/857 X |
| 3,502,987 | 3/1970 | Newton .................... 325/144 X |
| 3,518,578 | 6/1970 | Oppenheim et al. ........ 333/14 |
| 3,704,425 | 11/1972 | Haigh ...................... 333/14 X |
| 3,708,752 | 1/1973 | Fein ........................ 328/145 X |

*Primary Examiner*—Jin F. Ng
*Attorney, Agent, or Firm*—Orville N. Greene

[57] ABSTRACT

The efficiency of the transmitter modulator stage of the type in which an anode current $I_a$ of the modulator tube varies as a function of the grid voltage $U_g$ in accordance with the expression $I_a = k \cdot U_g^m$, $m \approx =1.5$, in which k is a material constant is improved by introducing a deaccentuator into the transmitter circuit. The deaccentuator functions to cause the anode current $I_a$ to vary in accordance with the equation $I_a = k[h(U_E)^n]^m$, where h and n are constants and $U_E$ is the signal applied to the input of the deaccentuator and $n = 1/m$ so that $I_a = k \cdot h^m \cdot U_E$ is a linear function.

8 Claims, 4 Drawing Figures

APPARATUS FOR IMPROVING THE EFFICIENCY OF THE MODULATION STAGE OF A TRANSMITTER

BACKGROUND OF THE INVENTION

The present invention is directed towards a method and apparatus for improving the efficiency of the modulation stage of a transmitter.

The dependence of the anode current $I_a$ of the modulator tube upon the grid voltage $U_g$ is represented, at least in a certain range, by the expression:

$I_a = k \cdot U_g^m$, where $m \approx 1.5$ and k is a material constant.

The modulation systems generally used today, anode modulation with push-pull Class AB modulation amplifiers, provide very stable operation, without problems, from the point of view of modulation characteristics. In order to keep the coefficient of harmonic distortion within reasonable limits, the grid bias of the modulator tubes must be adjusted so that the resulting control characteristic curve is linear. This leads to relatively high quiescent currents (see FIG. 1) and hence to the corresponding pure power dissipation:

$$P_{VO} = (I_O' + I_O'') \cdot U_a$$

With the present-day trend towards energy saving measures, however, other circuits are now being sought, for example pulse modulators, in order to improve the total efficiency of the transmitter. This approach is not without problems and the expense is high.

Since the above-mentioned power dissipation $P_{VO}$ results mainly from the measures to reduce the coefficient of harmonic distortion, this invention proposes a circuit in which this unwanted quiescent power can be considerably reduced by means of an appropriate deemphasis of the input signal and dispensing with any linearization of the characteristics of the output tubes.

BRIEF DESCRIPTION OF THE INVENTION

In accordance with this invention, there is provided a modulator circuit for a transmitter, having a modulator tube for which, at least within a predetermined range, the anode current $I_a$ varies as a function of the grid voltage $U_g$ in the following manner:

$$I_a = k \cdot U_g^m$$

k being a constant, and a deaccentuator is provided such that the anode current $I_a$ is given by:

$$I_a = k[h(U_E)^n]^m$$

where h and n are constants, $U_E$ is the signal at the input to the deaccentuator and $n = 1/m$ so that $I_a = k \cdot h^m \cdot U_E$ is a linear function.

BRIEF DESCRIPTION OF THE DRAWINGS

For the purpose of illustrating the invention, there is shown in the drawings a form which is presently preferred; it being understood, however, that this invention is not limited to the precise arrangements and instrumentalities shown.

DETAILED DESCRIPTION OF THE PREFERRED EMBODIMENTS

Figure 1:
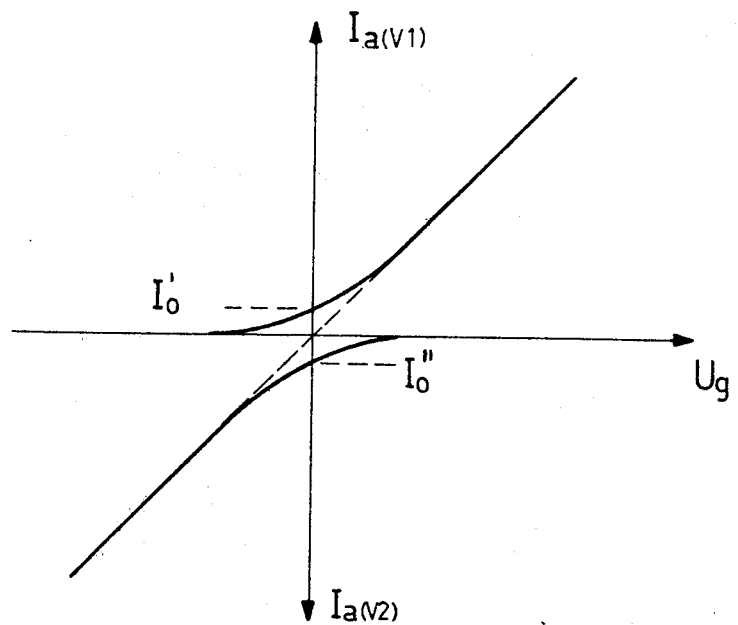
FIG. 1 is an $I_a$-$U_g$ characteristic of a typical prior art modulator.
Figure 2:
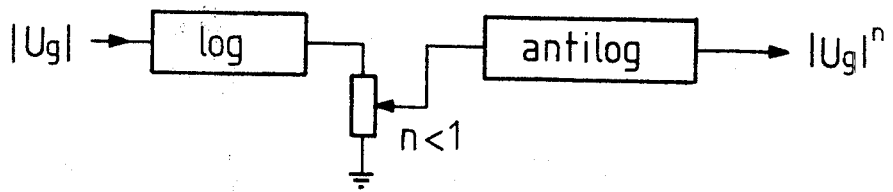
FIG. 2 is a schematic diagram of one form of deaccentuator for a modulator circuit in accordance with this invention.

In the circuits in accordance with the invention, a deaccentuator is provided to which an input signal $U_E$ is applied, the deaccentuator providing an output $(U_E)^n$, where $n = 1/m$. Since in certain circumstances the exponent m is an irrational number, the technical possibilities for realizing the above condition are limited. An indirect means, through logarithms, is recommended, as indicated in FIG. 2; raising the input signal to a higher power n is replaced by a simple multiplication carried out by a potentiometer.

In practice, a circuit which functions to simulate the above equation is obtainable in the form of an IC chip (for example Model 433 of the firm Analog Devices). The transfer function is given by:

$$E_O = \frac{10}{E_{ref}} \cdot U_y \left(\frac{U_z}{U_x}\right)^n,$$

where, in our case, constant values can be inserted for $E_{ref}$, $U_y$ and $U_x$. Thus, using this chip, the relation:

$$E_O = k(U_z)^n$$

is obtained with the following condition for n:

$$0.2 < n < 5$$

Thus the values which can be utilized in practice wherein $E_O$ is the output of the chip, $U_z$ is its input, and k is a constant in this chip are favorable for the present invention: for example $n = \frac{2}{3}$ for $m = 1.5$ or some other value of n is set depending on the value of m for the particular tube involved.

Figure 3:
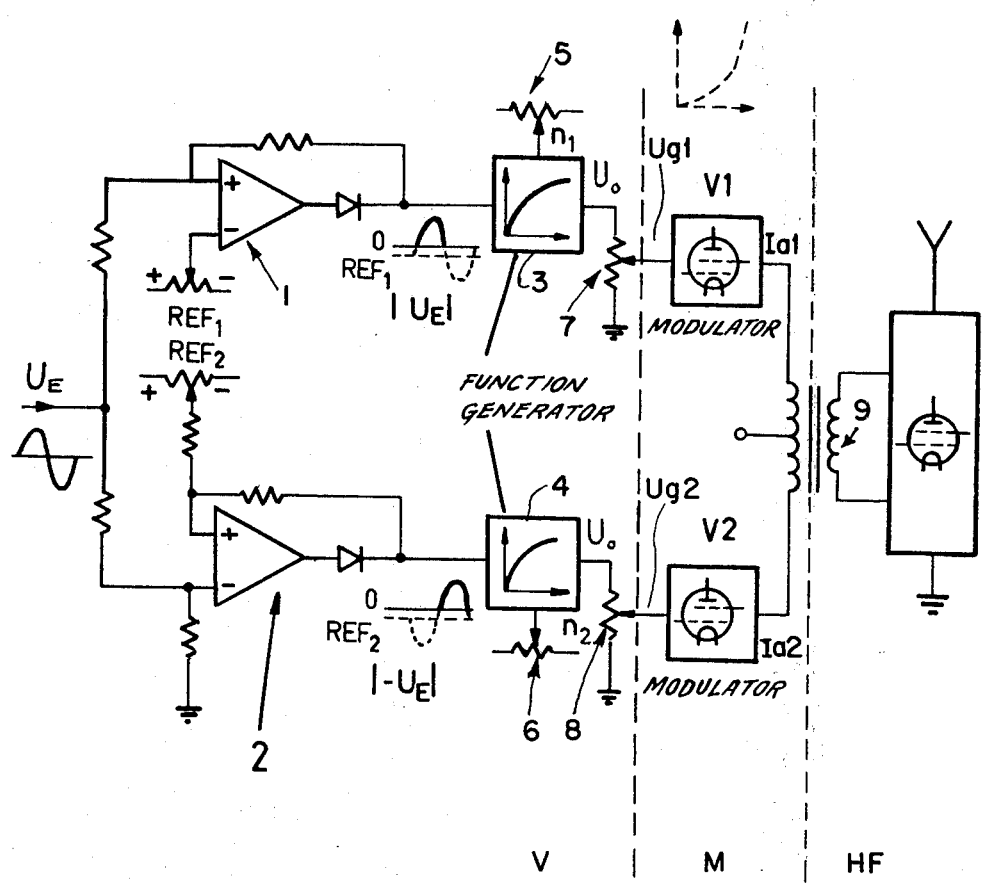
FIG. 3 is a diagram of a circuit in accordance with this invention, using a different deaccentuator.

FIG. 3 diagrammatically shows a suitable deaccentuator. Its input circuits 1 and 2 consist of respective "ideal diodes" each composed of an operational amplifier and a diode; thus the positive and negative half-waves of the signal are further treated separately. By appropriate poling of the inputs of the operational amplifiers, positive signals (half-waves) are obtained at their outputs. This is followed by means raising each of the signals to a higher power, comprising the above-mentioned function generators (IC chips) 3,4, the power values $n_1$ and $n_2$ of which are controlled by the position of potentiometers 5,6 and must correspond to the values $1/m_1$ and $1/m_2$ of the respective tubes $V_1$ and $V_2$.

Since each function generator 3,4 uses logarithms to generate its output, its output signal $U_o$ takes the form:

$$U_o = k[\text{sign}(U_E)][U_E]^n$$

wherein sign $(U_E)$ is the sign of the input signal applied to the respective function generator 3,4 (the sign into generator 3 being positive and the sign into generator 4 being negative), $U_E$ is the magnitude of the input signal $U_E$, and k and n are as defined above.

Figure 4:
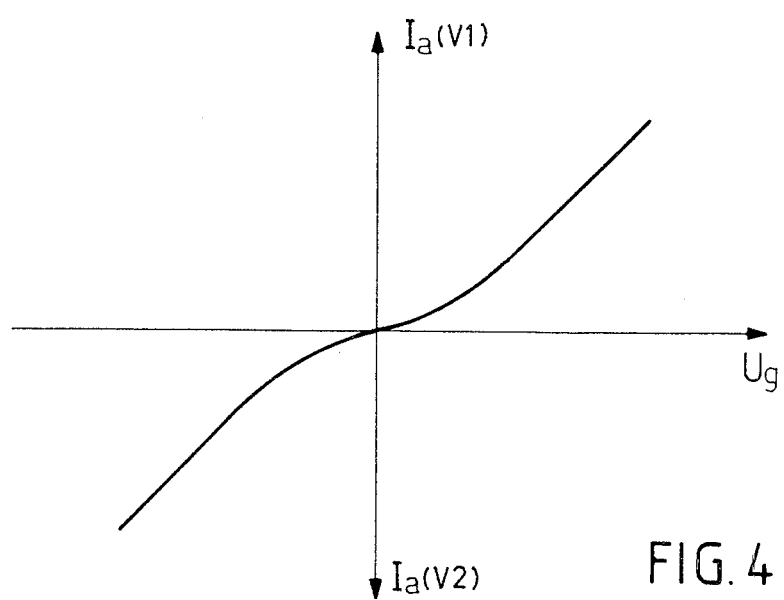
FIG. 4 is an $I_a$-$U_g$ characteristic of the FIG. 3 circuit.

By means of this circuit, the residual currents of the two tubes $V_1$ and $V_2$ are adjusted to zero, so that the whole $I_a/U_g$ tube characteristic curve has the form illustrated in FIG. 4. In FIG. 3, V is the deaccentuator, M the modulator and HG the high-frequency stage.

If the zero points are displaced slightly, in the negative direction by any external influences, this may lead, in certain circumstances, to interference effects in the passage through zero of the combined signal. So for practical reasons, the zero points may be displaced slightly in the positive direction (by reference voltages $REF_1$, $REF_2$), but only to such an extent that $I_o'$ and $I_o''$ do not assume importance. Furthermore, the reference voltages $REF_1$ and $REF_2$ must be applied to the inverting and non-inverting inputs of the input operational amplifiers 1 and 2, respectively, by means of two adjustable voltage dividers, as shown in FIG. 3.

A further advantage of this circuit consists in that the two tube factors $m_1$ and $m_2$ can be balanced out separately.

The output $U_O$ of each function generator 3,4 is applied to the grid of tubes $V_1$, $V_2$, respectively, via potentiometer 7, 8, respectively. Particularly, the voltage $Ug_1$ at the slide arm of potentiaometer 7 defines the grid voltage of tube $V_1$ and the voltage $Ug_2$ at the slide arm of potentiometer 8 defines grid voltage of tube $V_2$. The anode currents $Ia_1$, $Ia_2$ of tubes $V_1$, $V_2$, respectively, are applied to the primary windings of transformer 9 with the polarities shown in FIG. 4. The resultant voltages across the secondary winding of transformer 9 is applied to the high frequency stage HF which transmits the desired waveform.

In the majority of cases, the $I_a/U_g$ curve does not follow the theoretical exponential function, but "flattens" or straightens out upwards. In other words, this means that the lower portion of the curve follows an exponential function while, from a certain point on, the curve continues linearly as a tangent.

Such a "two-part" curve can also be dealt with by means of the above-mentioned IC chip. The electronic expense is greater but technically practicable. With modern electronic components, it is also possible to make the transition between the exponential and the linear parts of the curve continuous, so as to avoid unwanted interference effects.

The present invention may be embodied in other specific forms without departing from the spirit or essential attributes thereof and, accordingly, reference should be made to the appended claims, rather than to the foregoing specification as indicating the scope of the invention.

What is claimed is:

1. A transmitter comprising:
   (A) a modulator circuit having a modulator tube for which the anode current $I_a$ of said tube depends, at least within a predetermined range, upon the grid voltage $U_g$ of said tube in accordance with the equation $I_a = k \cdot U_g^m$, k and m being constants;
   (B) a deaccentuator means coupled to an input of said modulator circuit for causing said anode current $I_a$ to vary in accordance with the equation $I_a = k[-h(U_E)^n]^m$ where h and n are constants, $U_E$ is the signal at the input to the deaccentuator and $n = 1/m$ so that $I_a = k \cdot h^m \cdot U_E$ is a linear function of $U_E$; and
   (C) a high frequency stage for generating a high frequency carrier signal which is modulated by said anode current Ia;
   (D) said deaccentuator means comprising:
      (1) means for forming a logarithm of an input signal thereto;
      (2) means for multiplying the logarithm thus formed by a factor n; and
      (3) means for forming the antilogarithm of the multiplied logarithm.

2. A transmitter as claimed in claim 1, wherein said deaccentuator comprises an "ideal diode" which includes an operational amplifier and a following diode, the output of said following diode being connected to the input of a function generator arranged to produce the exponential function $h(U_E)^n$, the output voltage of said function generator being supplied to the grid of said modulator tube.

3. A transmitter as claimed in claim 1, in which an $I_a/U_g$ characteristic of the modulator tube follows a first, exponential course in said predetermined range and follows a different course thereafter, said deaccentuator being adapted to linearize the $I_a/U_E$ function into the range of said different course.

4. A transmitter as claimed in claim 3, wherein said deaccentuator comprises an "ideal diode" which includes an operational amplifier and a following diode, the output of said following diode being connected to the input of a function generator arranged to produce the exponential function $h(U_E)^n$, the output voltage of said function generator being supplied to the grid of said modulator tube.

5. A transmitter as claimed in claim 3, in which said different course is linear.

6. A transmitter as claimed in claim 5, wherein said deaccentuator comprises an "ideal diode" which consists of an operational amplifier and a following diode, the output of said following diode being connected to the input of a function generator arranged to produce the exponential function $h(U_E)^n$, the output voltage of said function generator being supplied to the grid of said modulator tube.

7. A transmitter as claimed in claim 3, in which said different course follows an exponential function $I_a = U_g^p$, where p is approximately but not exactly unity.

8. A transmitter as claimed in claim 7, wherein said deaccentuator comprises an "ideal diode" which consists of an operational amplifier and a following diode, the output of said following diode being connected to the input of a function generator arranged to produce the exponential function $h(U_E)^n$, the output voltage of said function generator being supplied to the grid of said modulator tube.

* * * * *